United States Patent
Morini et al.

(10) Patent No.: US 8,013,612 B2
(45) Date of Patent: Sep. 6, 2011

(54) GROUND FAULT DETECTION CIRCUIT FOR USE IN HIGH VOLTAGE MOTOR DRIVE APPLICATIONS

(75) Inventors: Sergio Morini, Pavia (IT); Marco Giandalia, Castronuovo Di Sicillia (IT); David Respigo, Pavia (IT); Stefano Ruzza, Mede (IT); Massimo Grasso, Trivolzio (IT)

(73) Assignee: International Rectifier Corporation, El Segundo, CA (US)

( * ) Notice: Subject to any disclaimer, the term of this patent is extended or adjusted under 35 U.S.C. 154(b) by 230 days.

(21) Appl. No.: 12/249,116

(22) Filed: Oct. 10, 2008

(65) Prior Publication Data

US 2009/0102488 A1    Apr. 23, 2009

Related U.S. Application Data

(60) Provisional application No. 60/984,847, filed on Nov. 2, 2007, provisional application No. 60/978,808, filed on Oct. 10, 2007.

(51) Int. Cl.
GO1R 31/02    (2006.01)
(52) U.S. Cl. ......................................... 324/509; 324/522

(58) Field of Classification Search .................. 324/509, 324/76.11, 522; 361/18, 54
See application file for complete search history.

(56) References Cited

U.S. PATENT DOCUMENTS

| | | | |
|---|---|---|---|
| 4,896,089 A | 1/1990 | Kliman et al. | |
| 5,561,380 A | 10/1996 | Sway-Tin et al. | |
| 5,687,049 A * | 11/1997 | Mangtani | ........................ 361/18 |
| 6,426,632 B1 | 7/2002 | Clunn | |
| 6,678,132 B1 | 1/2004 | Carruthers et al. | |
| 2002/0008950 A1 | 1/2002 | Kim et al. | |

* cited by examiner

Primary Examiner — Vincent Q Nguyen
(74) Attorney, Agent, or Firm — Farjami & Farjami LLP

(57) ABSTRACT

An integrated ground fault detection circuit in accordance with an embodiment of the present application includes a shunt resistor provided on a positive rail of a DC bus, a high voltage pocket including a sensory circuit connected to the shunt resistor and operable to detect a fault condition indicating a short circuit and a transmitter section operable to continuously transmit a fault condition signal indicating the fault condition and a low voltage pocket including a receiver operable to receive the fault condition signal from the sensory circuit and a logic unit, connected to the receiver, and operable to provide a fault output signal indicating the presence of a fault condition based on the fault condition signal.

18 Claims, 8 Drawing Sheets

| Parameter | Value |
|---|---|
| Technology | 600V HVIC technology |
| IC area | 1782 × 2534 μm² |
| DC+ BUS voltage | 40 ÷ 600 V |
| Package | SON8 dual inline |
| Opamp settable gain | 10 ÷ 50 |
| Comparator Hysteresis | 50 mV |
| Detection threshold | 260 ÷ 52 mV |
| Current dissipation | 150 mA |
| Temperature working range | -40 ÷ 150°C |
| Response time | 0.7 ÷ 3 μs |

Fig. 8

GROUND FAULT DETECTION CIRCUIT FOR USE IN HIGH VOLTAGE MOTOR DRIVE APPLICATIONS

CROSS-REFERENCE TO RELATED APPLICATIONS

The present application claims benefit of and priority to U.S. Provisional Patent Application Ser. No. 60/978,808 entitled P19-GNDFAULT-R00A filed Oct. 10, 2007 and U.S. Provisional Patent Application Ser. No. 60/984,847 entitled INTEGRATED GROUND FAULT DETECTOR IN HIGH VOLTAGE TECHNOLOGY FOR MOTOR DRIVE APPLICATIONS filed Nov. 2, 2007, the contents of each of which are hereby incorporated by reference herein.

The present application is also related to U.S. patent application Ser. No. 11/199,841 entitled START-UP CIRCUIT FOR PROVIDING A START-UP VOLTAGE TO AN APPLICATION CIRCUIT filed Aug. 9, 2005, the entire contents of which are hereby incorporated by reference herein.

BACKGROUND OF THE INVENTION

The present application relates to an integrated ground fault detector.

Integrated circuits have become increasingly common in motor drive applications. Many features that were previously realized using discrete components or multi-board systems in the past are now implemented using small and reliable integrated circuits (IC's). This allows users to save area on a board and provides better performance when compared to that of discrete solutions.

In one application, an inverter for use in a triphase motor, the prevention of motor and inverter faults is critical. Some types of inverter faults may be detected using a shunt resistor on the DC bus of the inverter. This shunt is commonly used to sense a current that is used by a controller to reconstruct the phase currents of the motor to control torque and speed thereof. However, this shunt may also be used to provide information about certain faults.

FIG. 1 illustrates an inverter circuit 1 in which a shunt resistor shunt1 is provided on the negative rail DC−bus of the DC bus between the rectifier bridge 10 and the inverter 12. While FIG. 1 illustrates a rectifier bridge 10 for providing the DC bus voltage, any suitable voltage source may be used. The shunt resistor shunt1 may be used to detect a short circuit in an inverter leg, that is, where the switching of the switches in the inverter creates a short circuit and/or a short between the phases of the motor, which is represented by switch s in FIG. 1. The dashed lines in FIG. 1 represent short circuit current paths. Another conventional way to detect faults is to sense the voltage drop on the power switches of the inverter. This is usually implemented inside the gate driver IC and is generally referred to as desaturation protection. However, this approach is difficult to implement since the power switches always have at least one terminal moving between the positive and negative two bus voltages.

Some faults can only be detected using a shunt resistor on the positive DC bus rail DC+bus. Thus, shunt1 of FIG. 1 is incapable of detecting these faults. FIG. 2 illustrates the inverter circuit 1 of FIG. 1 with a second shunt resistor shunt2 added to the positive DC rail DC+bus. The switch a in FIG. 2 represents a short between the positive DC bus DC+bus and the motor frame. The switch b represents a short between a motor phase and the motor frame. Since the motor frame is generally grounded, these shorts would avoid the negative DC bus rail DC−bus, and thus, would not be detectable by the shunt resistor shunt1, for example, in FIG. 1. Thus, at least two shunt resistors would be needed in order to provide the bare minimum of short circuit fault protection required for the inverter circuit 1

Other solutions to fault detection utilizing discrete components and use a large number of components. As a result, these solutions usually have low reliability and take up a substantial amount of area.

Thus, it would be beneficial to provide a fault detection circuit that avoids the problems mentioned above.

SUMMARY OF THE INVENTION

It is an object of the present invention to provide an integrated ground fault detection circuit that avoids the problems described above.

An integrated ground fault detection circuit in accordance with an embodiment of the present application includes a shunt resistor provided on a positive rail of a DC bus, a high voltage pocket including a sensory circuit connected to the shunt resistor and operable to detect a fault condition indicating a short circuit and a transmitter section operable to continuously transmit a fault condition signal indicating the fault condition and a low voltage pocket including a receiver operable to receive the fault condition signal from the sensory circuit and a logic unit, connected to the receiver and operable to provide a fault output signal indicating the presence of a fault condition based on the fault condition signal.

An integrated ground fault detection circuit for use in an inverter circuit connected to a motor in accordance with an embodiment of the present application includes a shunt resistor provided on a positive rail of a DC bus used to power the motor, a high voltage pocket including a sensory circuit connected to the shunt resistor and operable to detect a fault condition indicating a short circuit in at least one of the inverter circuit and the motor, and a transmitter section operable to continuously transmit a fault condition signal indicating the fault condition, a low voltage pocket including a receiver operable to receive the fault condition signal from the sensory circuit and a logic unit, connected to the receiver and operable to provide a fault output signal indicating the presence of a fault condition based on the fault condition signal.

Other features and advantages of the present invention will become apparent from the following description of the invention which refers to the accompanying drawings.

BRIEF DESCRIPTION OF THE DRAWING(S)

FIG. 8 is a table indicating exemplary parameter values for the integrated ground fault detection circuit in accordance with an embodiment of the present application

DETAILED DESCRIPTION OF THE EMBODIMENTS

The fault detection circuit of the present application utilizes monolithic high voltage technology to sense a voltage across a shunt resistor on the positive DC bus rail DC+bus. The circuit has a small area, utilizes low power and preferably utilizes a So8 package (8 pin dual line in). The circuit preferably does not require an external power supply and allows for the setting of the threshold for fault detection by modifying resistor values. Further, since the circuit is integrated, noise resulting from coupling is decreased.

The ground fault detection circuit of the present application is preferably implemented using integrated high voltage technology which allows both sensing circuitry which is referred to the positive rail of the DC bus DC+bus and digital logic which is referred to the negative rail of the DC bus DC−bus to be integrated in the same chip. In a preferred embodiment, the two sections are realized in two different n-epi pockets which are preferably epitaxially grown on a single p-type substrate connected to the DC bus. The high voltage pocket, or floating pocket, HV preferably has a specific geometric shape that allows the n-epi and p-sub junction to withstand a high reverse bias voltage. A resurf technique is preferably performed to properly shape the electrical field at the boundary of the floating pocket HV. Thus, the junction breakdown voltage can be tuned in order to reach as high as 600V. In a preferred embodiment the circuitry is generally implemented using MOSFET devices with 20V technology except for a part used for communication between the two pockets. This communication part is preferably implemented using high voltage MOSFET devices that can withstand a drain to source voltage of up to 600V and are used to generate short current pulses. This high voltage pmos device preferably has a gate and source terminal inside the HV pocket and a drain terminal inside the LV pocket, thus, it may be used to send a current pulse from the HV pocket to the LV pocket of the IC. In addition, a high voltage nmos device may be provided with a gate and source terminal inside the LV pocket and a source terminal in the RV pocket, and thus, can be used for transmission between the pockets.

Figure 1:
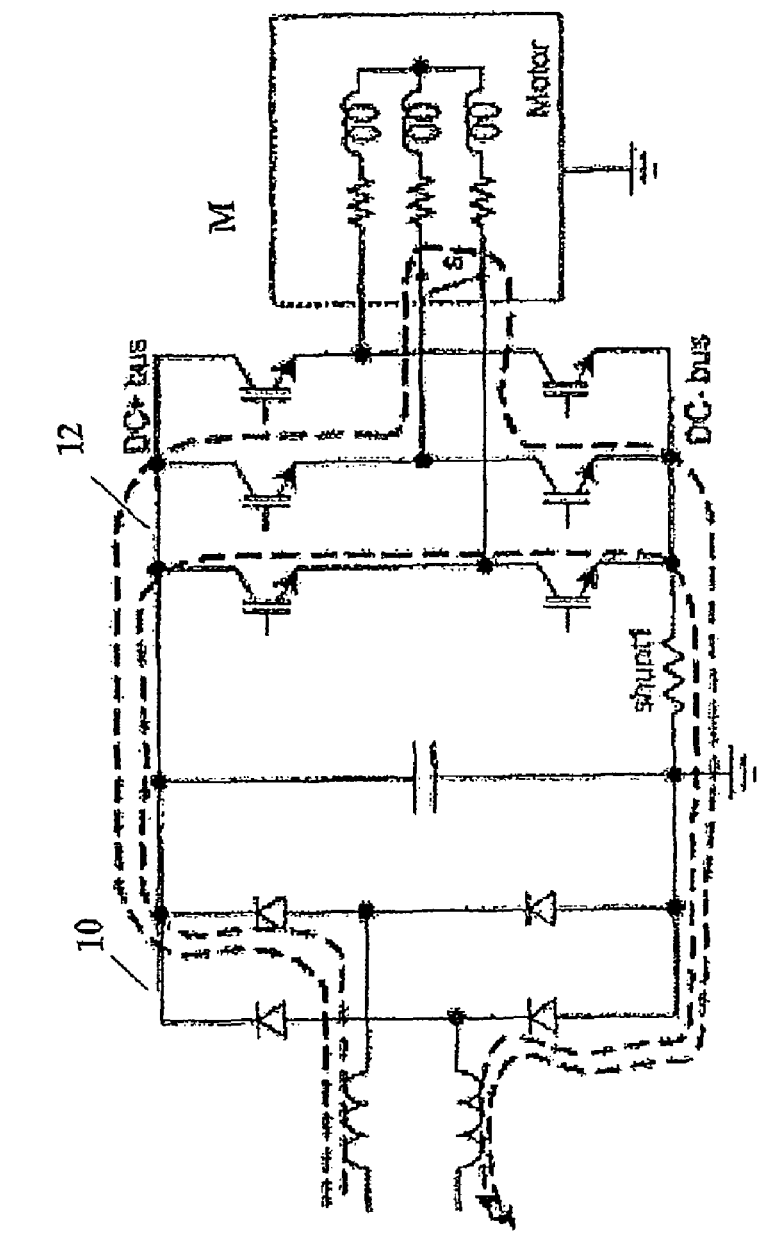
FIG. 1 illustrates an inverter circuit connected to a motor in which a shunt resistor is provided on the negative DC bus line.
Figure 2:
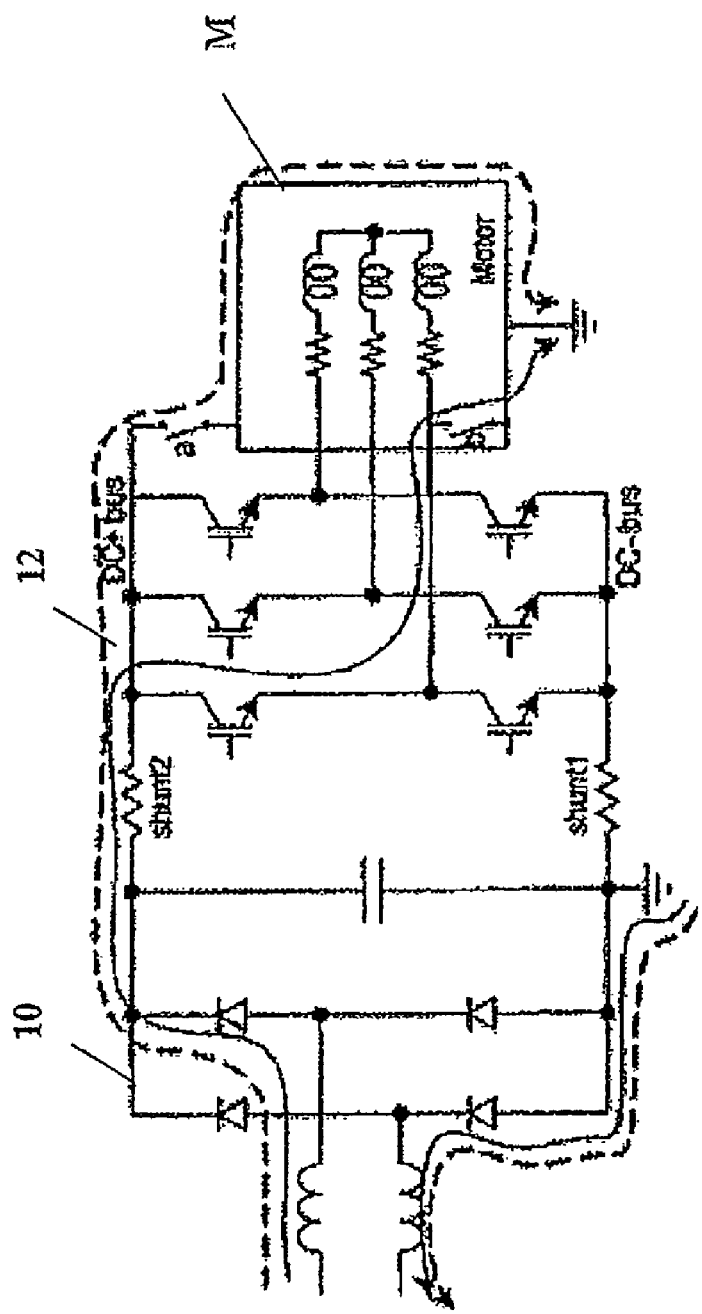
FIG. 2 illustrates an inverter circuit connected to a motor in which shunt resistors are provided on both the positive and negative DC bus lines.
Figure 3:
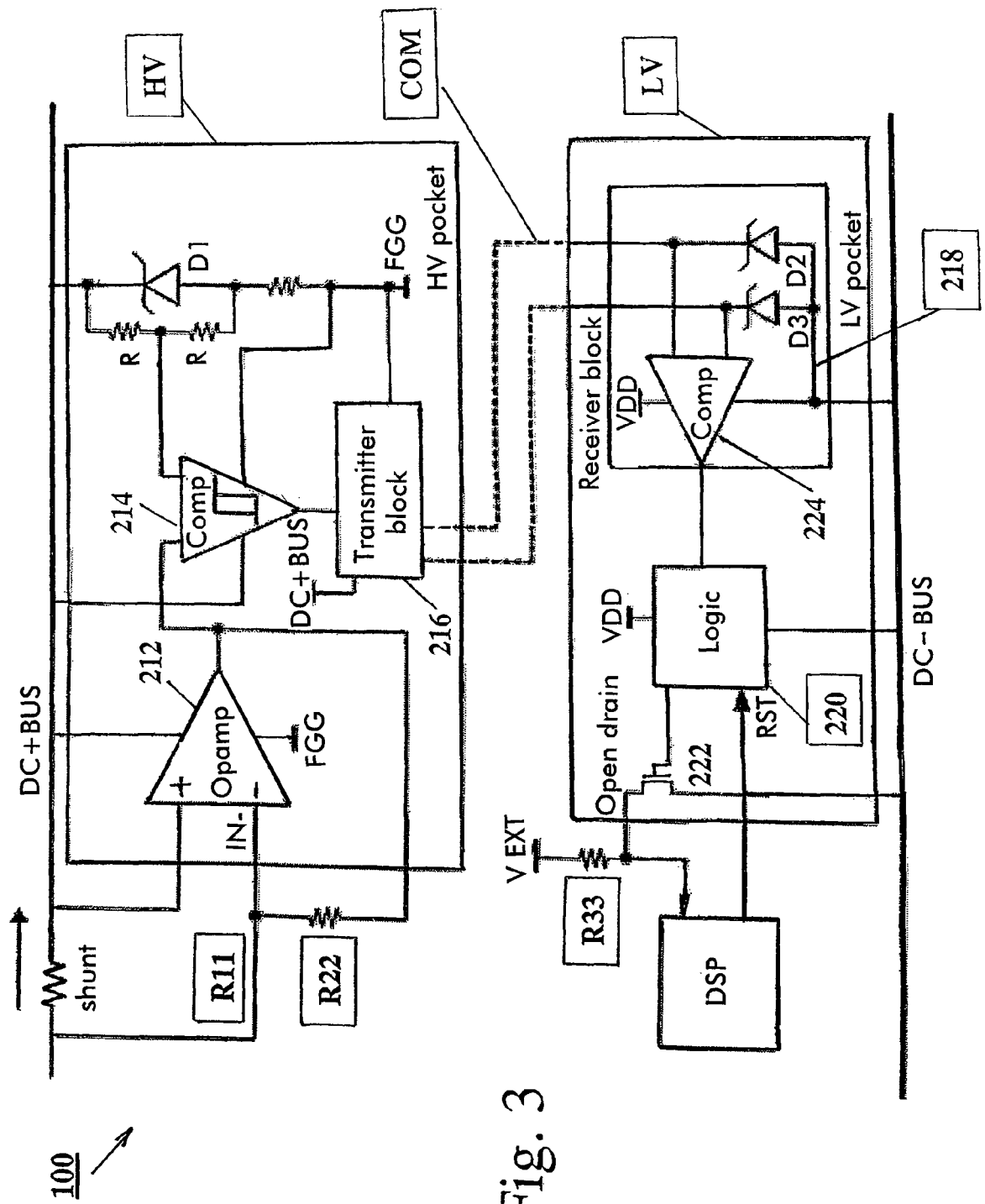
FIG. 3 illustrates an integrated ground fault detection circuit in accordance with an embodiment of the present application.

FIG. 3 illustrates a ground fault detection circuit 100 in accordance with an embodiment of the present application that generally includes three parts, a high voltage, or floating pocket, HV which includes sensing circuitry, the low voltage pocket LV, which includes digital logic and an open drain output which is connected to a processor device DSP, and a communication part COM that allows for communication between the HV pocket and the LV pocket.

Figure 4:
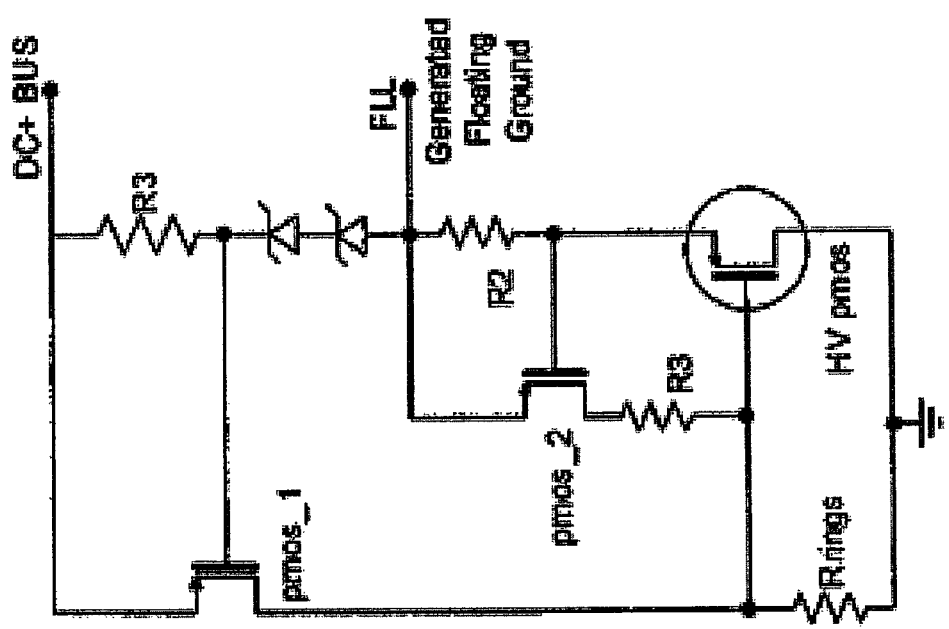
FIG. 4 illustrates an exemplary start up circuit that is suitable for use in the integrated circuit of FIG. 3.

In a preferred embodiment, the circuit 100 is an integrated circuit IC and does not require any external power supply. FIG. 4 illustrates an exemplary start up circuit 400 that may be used in conjunction with the IC of FIG. 3. This start up circuit is similar to that described in co-pending U.S. patent application Ser. No. 11/199,841 entitled START-UP CIRCUIT FOR PROVIDING A START-UP VOLTAGE TO AN APPLICATION CIRCUIT filed Aug. 9, 2005 which is assigned to the assignee of the present application, International Rectifier Corporation. Details regarding the start up circuit can be found in U.S. patent application Ser. No. 11/199,841 which is incorporated by reference herein. However, generally, the start up circuit 400 is connected between the rails of the DC bus DC+bus and DC−bus and is able to provide a floating ground reference FLL inside the HV pocket. The circuit 400 also includes feedback to control the bias current and power consumption. Feedback regulation is provided via the resistor R1 and the MOSFET pmos_1 which regulate the voltage at the gate of the high voltage MOSFET HVpmos to control the drain current, and thus, the floating ground reference FLL. Over current protection is provided by the device pmos_2 which senses a greater voltage drop across the resistor R2 when a short circuit is present, and turns on in response thereto. This results in the gate voltage at the high voltage MOSFET HVpmos rising, and thus, limiting the maximum current. That is, if an over current condition occurs, the source to gate voltage of the device pmos_2 increases and its drain terminal raises the gate voltage of the HVpmos. As a result reduction of the current through the resistor R2 takes place. The start up circuit 200 also provides an internal supply VDD for the LV pocket as well.

In a preferred embodiment, the high voltage pocket HV includes an operational amplifier 212, a comparator 214 and a transmitting block 216, which is part of the communication part 110 which allows for communication between the pockets HV, LV. The non-inverting input of operation amplifier 212 is connected to the shunt terminal of the shunt resistor shunt, on the motor side thereof. The inverting input of the operational amplifier 212 is connected to external resistive network R11, R22. As can be seen in FIG. 3, the resistor shunt is preferably on the positive rail of the DC bus DC+bus. The resistors R11, R22 associated with the amplifier 212 are not provided in the pocket HV so that regulation of the threshold for fault detection may be varied based on these resistor values. This allows establishment of a minimum voltage drop across the shunt resistor that is detectable by the comparator 214. In a preferred embodiment, hystersis is provided to avoid the effects of noise that is usually present on the positive rail of the DC bus DC+bus to detect the fault signal. Specifically, hysteresis of approximately 50 mV is provided to offset noise commonly associated with the positive rail DC+bus to prevent false fault detection. The threshold for the comparator 214 is set based on the two equal resistors R which split the voltage drop across the diode D1. The comparator compares the output of the amplifier 212 to the threshold voltage set by the resistors R. The output of the comparator 214 is high when the voltage drop across the shunt resistor indicated by the output of the amplifier 212 is larger than the threshold value. Otherwise, the output is low and no fault condition is present. The rail DC+bus provides the supply voltage for the sensing circuitry (212, 214) in pocket HV and is also a reference for the amplifier 212.

A receiver block 218 is provided in the LV pocket and a simple digital logic device 220 is connected thereto. In a preferred embodiment, the device 220 is a latch that is connected to an n-channel MOSFET 222 used as an open drain output. The transmitter block 216 and the receiver block 218 together form the communication part COM of the circuit 100.

Communication between the pockets HV, LV takes place between the transmitter block 216 and the receiver block 218. This communication may take place via short current pulses in order to reduce power dissipation. The pulses typically have a current of a few milliamperes that flows between the two pockets whose voltage difference can be as much as 600V.

Figure 5:
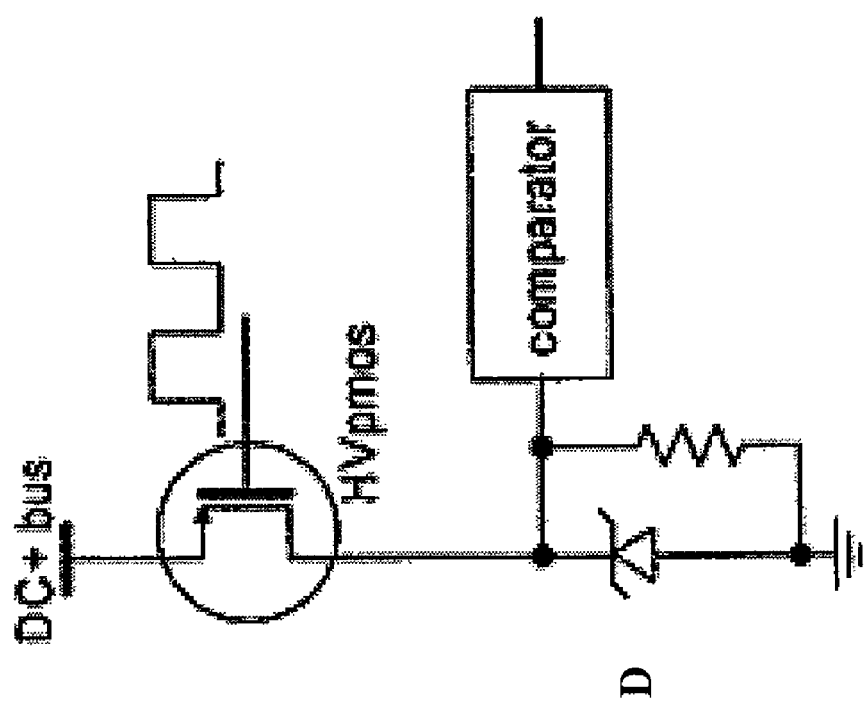
FIG. 5 illustrates an example of a communication circuit suitable for use in the integrated circuit of FIG. 3.

FIG. 5 illustrates an exemplary embodiment of a transmission and reception system that may be used in the transmitter block 218 and the receiver block 218. Pulses are generated using the HVpmos device which is preferably provided in the HV pocket, specifically in the transmitter block 216 and may be detected using the zener diode D and a comparator provided in the LV pocket, for example in the receiver block 218. The diode D provides a voltage of about 5V when current pulses across it. This results in a change in the comparator output. Thus, information may be provided from the high voltage pocket HV to the low voltage pocket LV via current pulses.

A latch is preferably used since a single pulse alone would not allow the processor DSP to determine whether the fault conditions were still present, and thus, would not allow the system to restart safely. The latch circuit preferably keeps the bit of the fault detection signal high until resolution of the fault, then the latch is reset. For example, the logic unit 220 of FIG. 3 may be a latch and the processor DSP may reset it via the reset signal RST.

An alternative would be to provide a series of pulses that repeat until the fault condition has been cleared. However, this would require an oscillator in the high voltage pocket RV and thus would increase current consumption and power dissipation. In addition, there is an increased chance of a false positive since the noise normally present on the positive DC rail DC+bus may result in an inadvertent pulse, based on the noise rather than a true fault as a result of the parasitic capacitance between the drain and body terminal of the HV pmos device.

In general, pulse transmission, while effective, is not ideal for communication between the pockets RV and LV. Thus, the IC 100 of the present application preferably utilizes a continuous time transmission system that uses the bias current of the pocket HV to communicate the bit of the fault condition to the LV pocket.

Figure 6:
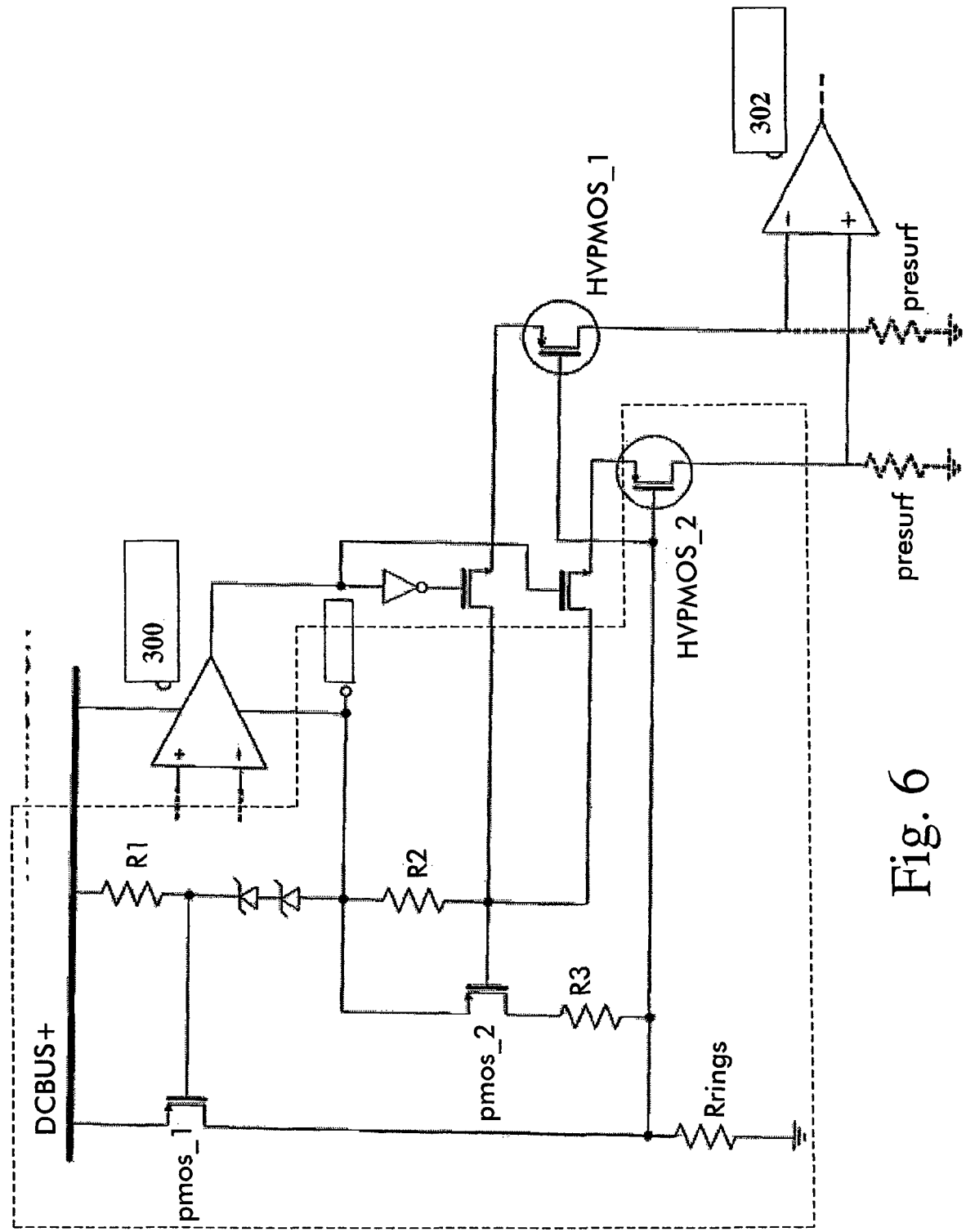
FIG. 6 illustrates a communication circuit for use in an integrated ground fault detection circuit in accordance with an embodiment of the present application.

FIG. 6 illustrates a preferred communication circuit utilized in the communication part COM. In the circuit of FIG. 6, the MOSFETS pmos_1, pmos_2, the resistors R1, R2, R3 and the high voltage MOSFET HVPMOS_1 correspond to the components of the start up circuit 200 illustrated in FIG. 4, for example and discussed above. Thus, feedback regulation is provided by resistor R1 and pmos_1 to regulate the voltage at the gate of the high voltage MOSFET HVPMOS_1 which controls the drain current such that a desired the floating ground voltage FLL is provided. Over current protection is provided by pmos_2 which senses the greater voltage drop across R2 when a short circuit is present and turns on, raising the voltage at the gate of HVPMOS_1 to limit the maximum current through R2. That is, these components operate in a manner similar to the start up circuit 200 described above The inclusion of on extra high voltage MOSFET HVPMOS_2 allows for continuous transmission from the high voltage pocket HV pocket to the low voltage pocket LV pocket without any significant increase in power consumption. Using the circuit of FIG. 6 the output of the comparator 300 controls the flow of current into the high voltage MOSFETS HVPMOS_1 and HVPMOS_2 and through to the comparator 302 of the low voltage pocket LV to convey information to the LV pocket. The comparator 300 preferably corresponds to the comparator 214 of FIG. 3 while the comparator 302 preferably corresponds to the comparator 224 in FIG. 3. If the output of the comparator 300 is low, the HVPMOS_1 is switched on, and the output of the comparator 302 is low. This represents a normal, non-fault condition. In contrast, if the output of the comparator 300 is high, the MOSFET HVPMOS_2 is switched on and the output of the comparator 302 is high. This indicates a fault condition, that is, a short circuit. This output is preferably provided to the latch 220 and then to the output terminal connected to the processor DSP.

The drain and gate of the high voltage MOSFETS HVPMOS_1 and HVPMOS_2 of FIG. 6 are preferably provided in the transmitter block 18 of FIG. 3 while the source terminals are preferably provided in the receiving block 218 of the low voltage pocket LV to provide continuous transmission of fault information to the low voltage pocket LV.

Thus, when a fault is present, the comparator 302 provides a high output to the logic unit 220, which preferably is a latch, as described above, which in turn provides that information to the processor DSP via the open drain output terminal. The DSP may then shut down the inverter 12, for example, in the case of a short circuit in order to prevent damage to switching elements or to the motor M. In a preferred embodiment, the output terminal is connected to an external voltage V_EXT via a resistor R3 whose value depends on the DSP parameters.

Figure 7:
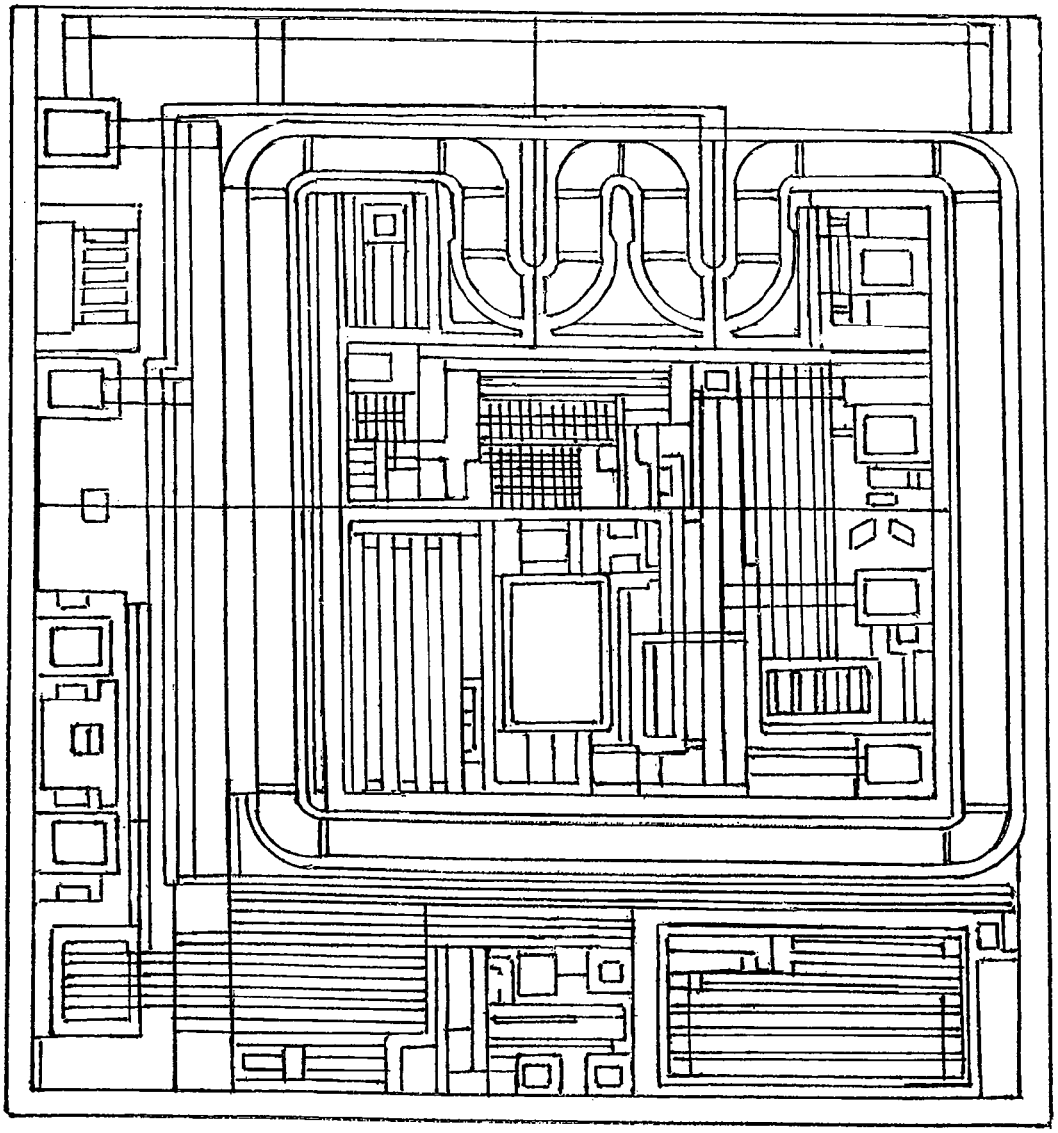
FIG. 7 illustrates the layout of the integrated circuit an integrated ground fault detection circuit in accordance with an embodiment of the present application.

FIG. 7 illustrates the layout of the integrated fault detection circuit of the present application. The table FIG. 8 illustrates some preferred parameter values for the integrated fault detection circuit of the present application.

Thus, the integrated fault detection circuit of the present application provides for the inclusion of sensory circuitry that may be used to detect a fault in an integrator circuit, for example, and logic circuitry in a single integrated circuit.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An integrated ground fault detection circuit comprises:
    a shunt resistor provided on a positive rail of a DC bus;
    a high voltage pocket including a sensory circuit connected to the shunt resistor and operable to detect a fault condition indicating a short circuit and a transmitter section operable to continuously transmit a fault condition signal indicating the fault condition; and
    a low voltage pocket including a receiver operable to receive the fault condition signal from the sensory circuit and a logic unit, connected to the receiver, and operable to provide a fault output signal indicating the presence of the fault condition based on the fault condition signal;
    the high voltage pocket and the low voltage pocket being integrated in the same chip.

2. The integrated ground fault detection circuit of claim 1, wherein the high voltage pocket further comprises:
    an operational amplifier connected to the shunt resistor such that the inverting input of the operation amplifier is connected to a source side of the shunt resistor and the non-inverting input is connected to the application side of the shunt resistor such that the output of the operational amplifier indicates a voltage drop across the shunt resistor; and
    a comparator operable to compare the output of the operational amplifier with a threshold voltage and to provide the fault detection signal based on the comparison, wherein the fault detection signal indicates a fault condition when the output of the operational amplifier exceeds the threshold voltage.

3. The integrated ground fault detection circuit of claim 2, wherein the transmitter further comprises:
    a first high voltage MOSFET including a first gate terminal connected to an output of the comparator; and
    a second high voltage MOSFET including a second gate terminal connected to the output of the comparator,
    wherein a first drain terminal and the first gate terminal of the first high voltage MOSFET and a second drain terminal and the second gate terminal of the second high voltage MOSFET are positioned in the transmitter and a first source terminal of the first high voltage MOSFET and a second source terminal of the high voltage MOSFET are positioned in the receiver such the voltage on the first and second source terminal, respectively, is based on the output of the comparator.

4. The integrated ground fault detection circuit of claim 3, wherein the receiver further comprises a second comparator operable to compare the voltage at the first source terminal to the voltage on the second source terminal and to provide an output signal indicating of the fault condition to the logic unit.

5. The integrated ground fault detection circuit of claim 4, wherein the output of the second comparator indicates a fault condition when the voltage of the second source terminal is greater than that at the first source terminal.

6. The integrated ground fault detection circuit of claim 5, wherein the logic unit is a latch circuit that holds a value provided by the output of the second comparator until a reset signal is received.

7. The integrated circuit of claim 6, further comprising an nmos MOSFET device with a gate connected to the logic unit and drain terminal provided as an output terminal of the circuit.

8. The integrate circuit of claim 7, further comprising a start up circuit operable to provide a floating ground reference for use in the high voltage pocket.

9. The integrated circuit of claim 8, wherein the start up circuit provides feedback to maintain a desired value for the floating ground reference.

10. An integrated ground fault detection circuit for use in an inverter circuit connected to a motor comprises:
   a shunt resistor provided on a positive rail of a DC bus used to power the motor;
   a high voltage pocket including a sensory circuit connected to the shunt resistor and operable to detect a fault condition indicating a short circuit in at least one of the inverter circuit and the motor, and a transmitter section operable to continuously transmit a fault condition signal indicating the fault condition; and
   a low voltage pocket including a receiver operable to receive the fault condition signal from the sensory circuit and a logic unit, connected to the receiver and operable to provide a fault output signal indicating the presence of the fault condition based on the fault condition signal;
   the high voltage pocket and the low voltage pocket being integrated in the same chip.

11. The integrated ground fault detection circuit of claim 10, wherein the high voltage pocket further comprises:
   an operation amplifier connected to the shunt resistor such that the inverting input of the operation amplifier is connected to a source side of the shunt resistor and the non-inverting input is connected to the motor side of the shunt resistor such that the output of the operational amplifier indicates a voltage drop across the shunt resistor; and
   a comparator operable to compare the output of the operational amplifier with a threshold voltage and to provide the fault detection signal based on the comparison, wherein the fault detection signal indicates a fault condition when the output of the operational amplifier exceeds the threshold voltage.

12. The integrated ground fault detection circuit of claim 11, wherein the transmitter further comprises:
   a first high voltage MOSFET including a first gate terminal connected to an output of the comparator; and
   a second high voltage MOSFET including a second gate terminal connected to the output of the comparator,
   wherein a first drain terminal and the first gate terminal of the first high voltage MOSFET and a second drain terminal and the second gate terminal of the second high voltage MOSFET are positioned in the transmitter and a first source terminal of the first high voltage MOSFET and a second source terminal of the high voltage MOSFET are positioned in the receiver such the voltage on the first and second source terminal, respectively, is based on the output of the comparator.

13. The integrated ground fault detection circuit of claim 12, wherein the receiver further comprises a second comparator operable to compare the voltage at the first source terminal to the voltage on the second source terminal and to provide an output signal indicate of the fault condition to the logic unit.

14. The integrated ground fault detection circuit of claim 13, wherein the output of the second comparator indicates a fault condition when the voltage of the second source terminal is greater than that at the first source terminal.

15. The integrated ground fault detection circuit of claim 14, wherein the logic unit is a latch circuit that holds a value provided by the output of the second comparator until a rest signal is received.

16. The integrated ground fault detection circuit of claim 15, further comprising an nmos MOSFET device with a gate connected to the logic unit and drain terminal provided as an output terminal of the circuit.

17. The integrated ground fault detection circuit of claim 16, further comprising a start up circuit operable to provide a floating ground reference for use in the high voltage pocket.

18. The integrated ground fault detection circuit of claim 17, wherein the start up circuit provides feedback to maintain a desired value for the floating ground reference.

* * * * *

UNITED STATES PATENT AND TRADEMARK OFFICE
CERTIFICATE OF CORRECTION

| | | |
|---|---|---|
| PATENT NO. | : 8,013,612 B2 | Page 1 of 1 |
| APPLICATION NO. | : 12/249116 | |
| DATED | : September 6, 2011 | |
| INVENTOR(S) | : Morini et al. | |

It is certified that error appears in the above-identified patent and that said Letters Patent is hereby corrected as shown below:

Title Page, Item (75) Inventors, line 3, "David Respigo" should be changed to --Davide Respigo--.

Signed and Sealed this
Thirteenth Day of December, 2011

David J. Kappos
*Director of the United States Patent and Trademark Office*